US00RE45517E

(19) United States
(12) Reissued Patent
Doverspike et al.

(10) Patent Number: US RE45,517 E
(45) Date of Reissued Patent: May 19, 2015

(54) VERTICAL GEOMETRY INGAN LED

(75) Inventors: Kathleen Marie Doverspike, Cary, NC (US); John Adam Edmond, Durham, NC (US); Hua-shuang Kong, Cary, NC (US); Heidi Marie Dieringer, Cary, NC (US); David B. Slater, Jr., Baskerville, VA (US)

(73) Assignee: Cree, Inc., Durham, NC (US)

(21) Appl. No.: 12/942,673

(22) Filed: Nov. 9, 2010

Related U.S. Patent Documents

Reissue of:
(64) Patent No.: 7,034,328
Issued: Apr. 25, 2006
Appl. No.: 10/115,522
Filed: Apr. 3, 2002

U.S. Applications:
(63) Continuation of application No. 12/108,604, filed on Apr. 24, 2008, now Pat. No. Re. 42,007, which is an application for the reissue of Pat. No. 7,034,328, which is a continuation of application No. 09/154,363, filed on Sep. 16, 1998, now Pat. No. 6,459,100.

(51) Int. Cl.
*H01L 33/00* (2010.01)
*H01L 29/06* (2006.01)

(52) U.S. Cl.
CPC ..... *H01L 33/0025* (2013.01)

(58) Field of Classification Search
CPC .... H01L 33/0025; H01L 33/32; H01L 33/325
USPC ..... 257/14
See application file for complete search history.

(56) References Cited

U.S. PATENT DOCUMENTS

| | | | |
|---|---|---|---|
| 4,313,125 | A | 1/1982 | Hartmann et al. |
| 4,862,471 | A | 8/1989 | Pankove |
| 5,004,135 | A | 4/1991 | Dufournet et al. |
| 5,146,465 | A | 9/1992 | Khan et al. |
| 5,290,393 | A | 3/1994 | Nakamura |

(Continued)

FOREIGN PATENT DOCUMENTS

| | | | |
|---|---|---|---|
| EP | 0772249 | A2 | 5/1979 |
| EP | 0541373 | A2 | 5/1993 |

(Continued)

OTHER PUBLICATIONS

Doverspike, K., Status of Nitride Based Light Emitting and Laser Diodes on SiC; Nitride Semiconductors Symposium, Nitride Semiconductors Symposium, Boston, MA, USA, Dec. 1-5, 1997, pp. 1169-1178.

(Continued)

*Primary Examiner* — Jerome Jackson, Jr.
(74) *Attorney, Agent, or Firm* — Myers Bigel Sibley & Sajovec, P.A.

(57) ABSTRACT

A vertical geometry light emitting diode is disclosed that is capable of emitting light in the red, green, blue, violet and ultraviolet portions of the electromagnetic spectrum. The light emitting diode includes a conductive silicon carbide substrate, an InGaN quantum well, a conductive buffer layer between the substrate and the quantum well, a respective undoped gallium nitride layer on each surface of the quantum well, and ohmic contacts in a vertical geometry orientation.

17 Claims, 4 Drawing Sheets

(56) References Cited

U.S. PATENT DOCUMENTS

| | | | | |
|---|---|---|---|---|
| 5,306,662 | A | 4/1994 | Nakamura et al. | |
| 5,319,657 | A | 6/1994 | Otsuka et al. | |
| 5,321,713 | A | 6/1994 | Khan et al. | |
| 5,334,277 | A | 8/1994 | Nakamura | |
| 5,432,808 | A | 7/1995 | Hatano et al. | |
| 5,433,169 | A | 7/1995 | Nakamura | |
| 5,563,422 | A | 10/1996 | Nakamura et al. | |
| 5,578,839 | A | 11/1996 | Nakamura et al. | |
| 5,585,648 | A | 12/1996 | Tischler | |
| 5,652,434 | A | 7/1997 | Nakamura et al. | |
| 5,661,074 | A | 8/1997 | Tischler | |
| 5,679,965 | A | 10/1997 | Schetzina | |
| 5,684,309 | A | 11/1997 | McIntosh et al. | |
| 5,777,350 | A | 7/1998 | Nakamura et al. | |
| 5,786,606 | A | 7/1998 | Nishio et al. | |
| 5,866,440 | A | 2/1999 | Hata | |
| 5,874,747 | A | 2/1999 | Redwing et al. | |
| 5,900,647 | A | 5/1999 | Inoguchi | |
| 5,923,690 | A * | 7/1999 | Kume et al. | 372/46.014 |
| 5,923,940 | A | 7/1999 | Baldwin et al. | |
| 5,932,896 | A | 8/1999 | Sugiura et al. | |
| 5,990,496 | A | 11/1999 | Kunisato et al. | |
| 6,017,774 | A | 1/2000 | Yuasa et al. | |
| 6,043,513 | A | 3/2000 | Kronlund | |
| 6,057,565 | A | 5/2000 | Yoshida et al. | |
| 6,172,382 | B1 * | 1/2001 | Nagahama et al. | 257/94 |
| 6,201,262 | B1 * | 3/2001 | Edmond et al. | 257/77 |
| 6,459,100 | B1 * | 10/2002 | Doverspike et al. | 257/97 |
| RE42,074 | E | 1/2011 | Kunisato et al. | |

FOREIGN PATENT DOCUMENTS

| | | | |
|---|---|---|---|
| EP | 0599224 | A1 | 6/1994 |
| EP | 0622858 | A3 | 11/1994 |
| EP | 0497350 | B1 | 8/1995 |
| EP | 0716457 | A2 | 6/1996 |
| EP | 0732754 | A2 | 9/1996 |
| EP | 10093192 | | 7/1997 |
| EP | 10145006 | | 5/1998 |
| EP | 10261816 | | 9/1998 |
| JP | 10093192 | A | 4/1998 |
| JP | 101455006 | A | 5/1998 |
| JP | 10261816 | A | 9/1998 |
| WO | WO 96/09653 | A1 | 3/1996 |

OTHER PUBLICATIONS

Amano et al. "Gallium nitride and related materials," Material Research Society Symposium Proceedings, vol. 395, pp. 869-877.

* cited by examiner

VERTICAL GEOMETRY INGAN LED

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

This is a continuation *reissue application of reissue application Ser. No. 12/108,604 filed Apr. 24, 2008, now U.S. Pat. No. Re. 42,007, which is a reissue application of Ser. No. 10/115,522, filed Apr. 3, 2002, now U.S. Pat. No. 7,034,328, which is a continuation* of Ser. No. 09/154,363 filed Sep. 16, 1998, U.S. Pat. No. 6,459,100.

The development of this invention included support from *the Defense Advanced Research Projects Agency* (DARPA) under contracts MDA972-95-C-0016 and F19628-96-C-0066. The government [may have] *has* certain rights in this invention.

FIELD OF THE INVENTION

This invention relates to light emitting diodes (LEDs) formed from Group III nitrides (i.e., Group III of the Periodic Table of the Elements), and in particular relates to LEDs that incorporate indium gallium nitride (InGaN) quantum wells as the active portion to produce output in the red to ultraviolet portions, and particularly the green to ultraviolet portions, of the electromagnetic spectrum.

BACKGROUND OF THE INVENTION

Light emitting diodes ("LEDs") are p-n junction devices that have been found to be useful in various roles as the field of optoelectronics has grown and expanded over the years. Devices that emit in the visible portion of the electromagnetic spectrum have been used as simple status indicators, dynamic power level bar graphs, and alphanumeric displays in many applications, such as audio systems, automobiles, household electronics, and computer systems, among many others. Infrared devices have been used in conjunction with spectrally matched phototransistors in optoisolators, handheld remote controllers, and interruptive, reflective, and fiber-optic sensing applications.

An LED operates based on the recombination of electrons and holes in a semiconductor. When an electron carrier in the conduction band combines with a hole in the valence band, it loses energy equal to the bandgap in the form of an emitted photon; i.e., light. The number of recombination events under equilibrium conditions is insufficient for practical applications but can be enhanced by increasing the minority carrier density.

In an LED, the minority carrier density is conventionally increased by forward biasing the diode. The injected minority carriers radiatively recombine with the majority carriers within a few diffusion lengths of the junction edge. Each recombination event produces electromagnetic radiation, i.e., a photon. Because the energy loss is related to the bandgap of the semiconductor material, the bandgap characteristics of the LED material have been recognized as being important.

As with other electronic devices, however, there exists both the desire and the need for more efficient LEDs, and in particular, LEDs that will operate at higher intensity while using less power. Higher intensity LEDs, for example, are particularly useful for displays or status indicators in various high ambient environments. There also is a relation between intensity output of the LED and the power required to drive the LED. Low power LEDs, for example, are particularly useful in various portable electronic equipment applications. An example of an attempt to meet this need for higher intensity, lower power, and more efficient LEDs may be seen with the development of the AlGaAs LED technology for LEDs in the red portions of the visible spectrum. A similar continual need has been felt for LEDs that will emit in the green, blue and ultraviolet regions of the visible spectrum. For example, because blue is a primary color, its presence is either desired or even necessary to produce full color displays or pure white light.

The common assignee of the present patent application was the first in this field to successfully develop commercially viable LEDs available in large quantities and that emitted light in the blue color spectrum. These LEDs were formed in silicon carbide; and examples are described in U.S. Pat. Nos. 4,918,497 and 5,027,168 to Edmond each titled "Blue Light Emitting Diode Formed in Silicon Carbide."

Other examples of such a blue LED are described in U.S. Pat. No. 5,306,662 to Nakamura et al. titled "Method of Manufacturing P-Type Compound Semiconductor" and U.S. Pat. No. 5,290,393 to Nakamura titled "Crystal Growth Method for Gallium Nitride-Based Compound Semiconductor." U.S. Pat. No. 5,273,933 to Hatano et al. titled "Vapor Phase Growth Method of Forming Film in Process of Manufacturing Semiconductor Device" also describes LEDs formed of GaInAlN on SiC substrates and Zinc Selenide (ZnSe) on gallium arsenide (GaAs) substrates.

General discussions of LED technology can be found at Dorf, The Electrical Engineering Handbook, 2d Ed. (1997, CRC Press), at pages 1915-1925, section 83.1, "Light Emitting Diodes," and in Sze, Physics of Semiconductor Devices, at pages 681 ff, Chapter 12, "LED and Semiconductor Lasers" (1981, John Wiley & Sons, Inc.).

As known to those familiar with photonic devices such as LEDs, the frequency of electromagnetic radiation (i.e., the photons) that can be produced by a given semiconductor material are a function of the material's bandgap. Smaller bandgaps produce lower energy, longer wavelength photons, while wider bandgap materials are required to produce higher energy, shorter wavelength photons. For example, one semiconductor commonly used for lasers is indium gallium aluminum phosphide (InGaAlP). Because of this material's bandgap (actually a range of bandgaps depending upon the mole or atomic fraction of each element present), the light that InGaAlP can produce is limited to the red portion of the visible spectrum, i.e., about 600 to 700 nanometers (nm).

Working backwards, in order to produce photons that have wavelengths in the blue or ultraviolet portions of the spectrum, semiconductor materials are required that have relatively large bandgaps. Typical candidate materials include silicon carbide (SiC) and Group III nitrides, particularly gallium nitride (GaN), and ternary and tertiary Group III nitrides such as aluminum gallium nitride (AlGaN), indium gallium nitride (InGaN), and aluminum indium gallium nitride (AlInGaN).

Shorter wavelength LEDs offer a number of advantages in addition to color. In particular, when used in optical storage and memory devices (e.g., "CD-ROM" or "optical disks"), their shorter wavelengths enable such storage devices to hold proportionally more information. For example, an optical device storing information using blue light can hold approximately 4 times as much information as one using red light, in the same space.

The Group III nitrides, however, are attractive LED candidate material for green, blue, and UV frequencies because of their relatively high bandgaps (i.e., GaN is 3.36 eV at room temperature) and because they are direct bandgap materials rather than an indirect bandgap material. As known to those familiar with semiconductor characteristics, a direct bandgap material is one in which an electron's transition from the valence band to the conduction band does not require a change in crystal momentum for the electron. In indirect semiconductors, the alternative situation exists; i.e., a change of crystal momentum is required for an electron's transition between the valence and conduction bands. Silicon and silicon carbide are examples of such indirect semiconductors.

Generally speaking, LEDs formed in direct bandgap materials will perform more efficiently than ones formed in indirect bandgap materials because the photon from the direct transition retains more energy than one from an indirect transition.

The Group III nitrides suffer from a different disadvantage, however: the failure to date of any workable technique for producing bulk single crystals of Group III nitrides which could form appropriate substrates for Group III nitride photonic devices. As is known to those familiar with semiconductor devices, they all require some sort of structural substrate. Typically, a substrate formed of the same materials as the active region of a device offers significant advantages, particularly in crystal growth and matching. Because Group III nitrides have yet to be formed in such bulk crystals, however, Group III nitride photonic devices must be formed in epitaxial layers on different—i.e., other than Group III nitride—substrates.

Using different substrates, however, causes an additional set of problems, mostly in the areas of crystal lattice matching and thermal coefficients of expansion (TCEs). In almost all cases, different materials have different crystal lattice parameters and TCEs. As a result, when Group III nitride epitaxial layers are grown on a different substrate, some crystal mismatch will occur, and the resulting epitaxial layer is referred to as being either "strained" or "compressed" by these mismatches. Such mismatches, and the strain they produce, carry with them the potential for crystal defects which in turn affect the electronic characteristics of the crystals and the junctions, and this correspondingly tend to degrade or even prevent the performance of the photonic device. Such defects are even more problematic in higher power structures.

To date, a common substrate for Group III nitride devices has been sapphire; i.e., aluminum oxide ($Al_2O_3$). Sapphire is optically transparent in the visible and UV ranges, but is unfortunately insulating rather than conductive, and carries a lattice mismatch with (for example) gallium nitride of about 16%. In the absence of a conductive substrate, "vertical" devices (those with contacts on opposite sides) cannot be formed, thus complicating the manufacture and use of the devices.

As a particular disadvantage, horizontal structures (those with contacts on the same side of the device), such as those required when Group III nitride layers are formed on sapphire, also produce a horizontal flow of current and therefore the current density through the layer is substantially increased. This horizontal current flow puts an additional strain on the already-strained (e.g., a 16% lattice mismatch between GaN and sapphire) structure and accelerates the degradation of the junction and the device as a whole.

Gallium nitride also carries a lattice mismatch of about 2.4% with aluminum nitride (AlN) and a 3.5% mismatch with silicon carbide. Silicon carbide has a somewhat lesser mismatch (only about 1%) with aluminum nitride.

OBJECT AND SUMMARY OF THE INVENTION

Therefore, it is an object of the present invention to provide an improved brightness light emitting diode that takes advantage of the light emitting characteristics of indium gallium nitride along with the advantages of silicon carbide substrate.

The invention meets this object with a vertical geometry light emitting diode that is capable of emitting light in the red, green, blue, violet, and ultraviolet portions of the electromagnetic spectrum. The light emitting diode comprises a conductive silicon carbide substrate, an indium gallium nitride quantum well, a conductive buffer layer between the substrate and the quantum well, respective undoped gallium nitride layer on each surface of the quantum well, and ohmic contacts to the device in a vertical geometry orientation.

In another aspect, the invention is a vertical geometry light emitting diode formed of an n-type silicon carbide substrate, a conductive buffer layer on the substrate, a first layer of gallium nitride on the conductive buffer layer that is n-type, a second layer of gallium nitride on the first gallium nitride layer that is undoped, an indium gallium nitride quantum well on the second gallium nitride layer, a third layer of gallium nitride on the quantum well that is undoped, a first layer of aluminum gallium nitride on the third gallium nitride layer that is undoped, a second layer of aluminum gallium nitride that is p-type on the first aluminum gallium nitride layer, a fourth gallium nitride layer that is p-type on the second aluminum gallium nitride layer, an ohmic contact to the substrate, and an ohmic contact to the fourth gallium nitride layer.

The foregoing and other objects and advantages of the invention will become clearer when taken in conjunction with the detailed description and the accompanying drawings in which:

DETAILED DESCRIPTION

Figure 1:
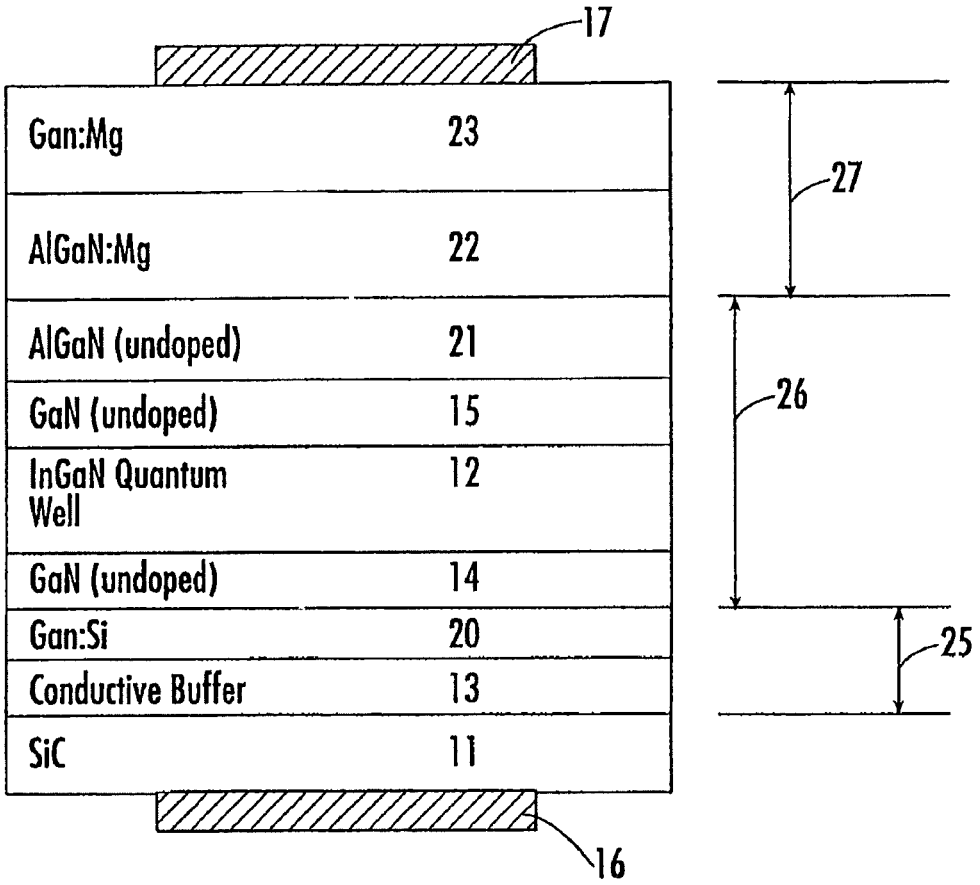
FIG. 1 is a cross-sectional diagram of a light emitting diode according to the present invention.

The present invention is a vertical geometry light emitting diode that is capable of emitting light in the red, green, blue, violet, and ultraviolet portions of the electromagnetic spectrum. As used herein, the phrase "vertical geometry" refers to the characteristic in which ohmic contacts to a device can be placed on opposite surfaces of the structure. Such geometry allows appropriate metal contacts and wire leads (including wire leads in microprocessors and printed circuits) to be more easily made to the device, as opposed to those in which the anode and cathode must be placed on the same surface of the device. FIG. 1 illustrates the device broadly designated at 10, which in its broadest aspects comprises the conductive silicon carbide substrate 11, an indium gallium nitride quantum well 12, a conductive buffer layer 13 between the substrate 11 and the quantum well 12, respective undoped gallium nitride layers 14 and 15 on each surface of the quantum well 12, and ohmic contacts 16 and 17 in a vertical geometry orientation.

The silicon carbide substrate 11 is preferably selected from among the 3C, 4H, 6H, and 15R polytypes, and most preferably is the 6H polytype. The substrate is most preferably formed according to the growth techniques set forth in commonly assigned (or licensed) U.S. Pat. No. Re. 34,861 (U.S. Pat. No. 4,866,005), the contents of which are incorporated entirely herein by reference.

The conductive buffer 13 is preferably formed to have the structure, and incorporating the methods, set forth in co-pending and commonly assigned pending U.S. application Ser. No. 08/944,547, filed Oct. 7, 1997, for "Group III Nitride Photonic Devices on Silicon Carbide Substrates with Conductive Buffer Interlayer Structure," the contents of which are incorporated entirely herein by reference.

As noted above, a silicon carbide substrate has a better lattice match with Group III nitrides than does sapphire. Furthermore, Group III nitrides are in tension on silicon carbide whereas they are in compression on sapphire. As used in this art, "tension" refers to the relationship in which the coefficient of thermal expansion of an epitaxial layer is higher than that of its substrate. "Compression" refers to the alternative relationship in which the coefficient of thermal expansion of an epitaxial layer is lower than that of its substrate. As between Group III nitride layers and silicon carbide substrates, the differences in the lattice constants (those of the nitrides are higher than those of silicon carbide) add to the compression, but the overall tension tends to be dominated by the respective coefficients of thermal expansion. In this regard, there are almost no reports of InGaN growth on an epilayer that is under tension.

As known to those familiar with electronic structures, a quantum well is typically formed of one or several thin layers of a semiconductive material that has active layers that are very thin. In particular, when the thickness of the active layer is reduced to the order of the deBroglie wavelength of the carrier, the result is a series of discrete energy levels that have the bound state energies of a finite square well. See, Sze Physics of Semiconductor Devices, 2d Ed. (1981) at pp. 127 and 729. As recognized by those familiar with such structures, the use of single or multiple quantum wells increases the electron density in the desired transitions and thus produces increased brightness in the resulting emissions.

Taken in more detail, the silicon carbide substrate 11 is n-type, and a first layer of n-type gallium nitride 20, typically doped with silicon, is on the conductive buffer layer 13 and borders the (second) undoped layer of gallium nitride 14 referred to above.

The preferred structure also includes a first layer of undoped aluminum gallium nitride 21 on the other undoped gallium nitride layer 15 which is the third gallium nitride layer overall. A second layer of aluminum gallium nitride 22 that is p-type (preferably doped with magnesium) is on the first undoped layer 21. A p-type gallium nitride layer 23, the fourth gallium nitride layer overall, completes the device and is preferably doped with magnesium. As FIG. 1 illustrates, an ohmic contact 16 is made to the conductive silicon carbide substrate and another ohmic contact 17 is made to the p-type gallium nitride layer 23. In preferred embodiments, the ohmic contact 16 to the substrate 11 comprises nickel (Ni) and the ohmic contact 17 to the p-type gallium nitride layer 23 is formed of platinum (Pt). Other metals can be used for the ohmic contacts provided, of course, that they have the appropriate ohmic characteristics with respect to the layers they contact, and that they provide an appropriate chemical and physical attachment to the respective layers.

In preferred embodiments, the indium gallium nitride quantum well 12 is intrinsically n-type, and can comprise a single (SQW) or a multiple quantum well (MQW).

Each of the layers offers particular advantages in the overall structure of the invention. As noted above, the n-type silicon carbide substrate has a much higher thermal conductivity than sapphire, provides a much better lattice match with Group III nitrides than does sapphire, and its conductive characteristics make it ideal for a vertical device.

The conductive buffer layer 13 serves the purposes set forth in co-pending application Ser. No. 08/944,547, filed Oct. 7, 1997, as referred to and incorporated above. In its basic function, the conductive buffer layer 13 provides an advantageous crystal transition from the silicon carbide substrate to the gallium nitride layers 20 and 14, and its conductive characteristics complement and enable the vertical geometry of the device.

The first gallium nitride layer 20, together with the conductive buffer 13, have a total thickness of about 1.8 microns. The conductive buffer layer 13 and the gallium nitride layer 20 are preferably grown under a hydrogen ($H_2$) atmosphere at a temperature of about 1040° C. in preferred circumstances. The n-type gallium nitride layer 20 should be thick enough to minimize defects propagated from the interface between the silicon carbide substrate 11 and the conductive buffer 13, and to planarize the overall surface. If the layer is too thin, it empirically appears to affect the wavelength uniformity of the device.

The undoped gallium nitride layer 14, which in the preferred embodiment is the second gallium nitride layer overall, has been demonstrated to increase the brightness and the emission uniformity of the device. Although this remains an empirical result to date, and applicants do not wish to be bound by any particular theory, it appears that the undoped gallium nitride layer 14 (which is grown under a nitrogen atmosphere) tends to trap or bury hydrogen so that it does not later affect the InGaN quantum well which must be isolated from nitrogen. The use of the undoped gallium nitride layer 14 also eliminates any growth stop that would otherwise be required because it is grown in the same nitrogen ($N_2$) atmosphere in which the InGaN quantum well is later grown. When a growth stop is scheduled during the manufacture of these types of devices, the interface between the layers grown before and after the stop can tend to degrade.

Alternatively, the undoped gallium nitride layer 14 may simply help release the strain that has been built up between the silicon carbide substrate and the Group III nitride layers thereon. As noted above, the undoped gallium nitride layer 14 is grown under a nitrogen atmosphere (as opposed to the n-type predecessor layer 20 of gallium nitride that was grown under a hydrogen atmosphere) and preferably at temperatures of between about 750° and 800° C. to a total thickness of about 200 angstroms.

The indium gallium nitride quantum well 12 can be a single or multiple quantum wells and is typically grown to a thickness of between about 20 and 30 angstroms at temperatures of between about 750° and 800° C. under the same nitrogen atmosphere as the undoped gallium nitride layer 14. The quantum well is, of course, the active layer of the device and produces the desired output. From a functional standpoint, the quantum well 12 should be "pseudomorphic" or "metastable"; i.e., thin enough to avoid crystal defects that would tend to appear in thicker layers of the otherwise similar or identical material.

As well known to those familiar with Group III nitrides, the band structure and thus the emission of the quantum well differs depending upon the amount of indium in the ternary compound, see e.g., U.S. Pat. No. 5,684,309 at FIGS. 10 and 11 and Column 7, lines 19-42, which are illustrative, but not limiting, of this characteristic. For blue LEDs, the mole fraction of indium is about 35 percent while for green LEDs the mole fraction of indium is somewhat higher, preferably between about 50 and 55 percent. The devices can thus be designed to emit at specific wavelengths by controlling the mole fraction (or mole percentage) of indium in the ternary InGaN compound. Larger fractions of indium tend to be more unstable than smaller fractions, however, and thus this characteristic is typically considered in selecting a desired or optimum composition for the quantum well(s).

The third overall gallium nitride layer 15 is the other undoped gallium nitride layer bordering the quantum well 12 and serves to protect the InGaN quantum well 12 from any exposure to hydrogen or high temperatures during the crystal growth processes.

The upper undoped gallium nitride layer 15 is likewise grown in a nitrogen atmosphere for the purpose of protecting the quantum well 12 from exposure to hydrogen. Additionally, the gallium nitride layer 15 protects the InGaN quantum well 12 from exposure to high temperatures, it being recognized that at about 950° C. or above, InGaN decomposes.

The undoped aluminum gallium nitride layer 21 has a generally higher crystal quality than doped AlGaN and along with the undoped gallium nitride layer 15 helps protect the InGaN quantum well from exposure to either higher than desired temperatures or exposure to hydrogen. The undoped AlGaN layer 21 is grown in a nitrogen atmosphere.

In general, a hydrogen atmosphere produces higher quality layers of GaN and AlGaN, but affects InGaN detrimentally. Thus, wherever possible, growth is carried out in the hydrogen atmosphere, changing to the nitrogen atmosphere to successfully grow the InGaN quantum well and its adjacent layers.

Both the undoped gallium nitride layer 15 and the undoped aluminum gallium nitride layer 21 are relatively thin. The gallium nitride layer 15 is on the order of 20-30 angstroms and is grown at a temperature of between about 750° and 800° C. The undoped aluminum gallium nitride layer 21 has a thickness of between about 30 and 50 angstroms, and is grown at temperatures of about 800° to 850° C.

The p-type aluminum gallium nitride layer 22 is somewhat thicker, on the order of about 200 angstroms and is grown in a hydrogen atmosphere at temperatures above about 900° C. It provides a high-quality crystal layer to the overall structure and provides the holes that are injected into the quantum well to produce the desired emission. Finally, the p-type gallium nitride contact layer 23 provides a more convenient material for the ohmic contact 17. As known to those familiar with these materials, making an appropriate ohmic contact to aluminum gallium nitride is at least difficult, and in many cases impossible.

The growth gases for the various layers are straightforward. Silane ($SiH_4$) trimethylgallium ($(CH_3)_3Ga$) and ammonia ($NH_3$) are used to form the n-type gallium nitride layer 20. Triethylgallium ($(C_2H_5)_3Ga$) can be used in place of trimethylgallium as may be desired. Similarly, indium and aluminum are provided using trimethylindium ($(CH_3)_3In$) or trimethylaluminum ($(CH_3)_3Al$) as the source gases. Ammonia is likewise the preferred source gas for the nitrogen for each of the layers.

As noted above, in the preferred embodiments, the conductive buffer layer 13 and the first GaN layer 20 are grown in a hydrogen atmosphere that facilitates their growth and desired characteristics. This growth under $H_2$ is indicated by the arrow 25 in FIG. 1. The second GaN layer 14, the InGaN quantum well 12, the third GaN layer 15, and the first AlGaN layer 21 are then grown under a nitrogen atmosphere and preferably without a growth stop. Finally, the second AlGaN layer 22 and the fourth GaN layer 23 are grown under a hydrogen atmosphere, and again preferably without a growth stop. In this manner, the InGaN quantum well 12 as well as the layers bordering it are all grown without a growth stop, because the changeover from hydrogen to nitrogen atmosphere occurs at the undoped GaN layer 14, and the corresponding changeover from nitrogen back to hydrogen occurs after the undoped AlGaN layer 21. As known to those familiar with crystal growth—and specifically CVD epitaxial growth—techniques, the continuous growth process tends to produce noticeably better interfaces between epitaxial layers than do growth processes that include stops. In this manner, the structure of the LED according to the invention enhances the growth technique and the continuous growth technique enhances the resulting performance of the LED.

In preferred embodiments, the silicon carbide substrate 11 is "back implanted." As background, temperatures of 930° C. (at least) are required to obtain an ohmic contact on n-type silicon carbide that is typically doped at between about 6E17 and 2E18 in LEDs. Such temperatures do not generally adversely affect gallium nitride, but tend to degrade or destroy the indium gallium nitride quantum well 12. Accordingly, in order to obtain a good ohmic contact to silicon carbide at lower temperatures, the silicon carbide substrate 11 is highly doped on the back side, a technique that enables an appropriate ohmic contact to be formed at temperatures of as low as 800° C. with the expectation being that temperatures as low as 750° C. can similarly be obtained.

The highly doped back side of the silicon carbide substrate 11 is preferably doped by ion implantation, although other techniques such as a laser anneal or even a thin epitaxial layer (which can be impractical under many circumstances) could also be used. By way of example rather than limitation, the silicon carbide substrate 11 is normally doped at about 1.2 E 18 ($1.2\times10^{18}$ $cm^{-3}$), and the implanted part reaches a concentration of about 1 E 20 ($1\times10^{20}$ $cm^{-3}$).

Accordingly, in another aspect, the invention comprises the method of producing the vertically oriented light emitting diode of the invention. In this aspect, the invention comprises successively growing a conductive buffer layer and an n-type gallium nitride layer in a hydrogen atmosphere on an n-type silicon carbide substrate. Thereafter, successive layers are grown of thin undoped gallium nitride, the indium gallium nitride quantum well, a second thin layer of undoped gallium nitride, and a thin layer of undoped aluminum gallium nitride in a nitrogen atmosphere. The technique is completed by thereafter successively growing a layer of p-type aluminum gallium nitride and a layer of p-type gallium nitride in a hydrogen atmosphere. The ohmic contacts can then be added to the p-type gallium nitride layer and to the silicon carbide substrate with preferred embodiments including the step of increasing the doping of the silicon carbide substrate at the portion where the ohmic contact is added in the manner just described; i.e., preferably by ion implantation. The sources gases are those mentioned above.

As indicated by the source gases, the preferred technique for growth of these layers is chemical vapor deposition (CVD). Such techniques are very well understood in this art. The nature of CVD, and of individual CVD equipment, is nevertheless such that individual gas flow rates, temperatures, reactor pressures, time periods, and other process parameters must generally be determined based upon particular equipment and circumstances. Given the composition of the layers as described herein, including the thicknesses of each layer, and the preferred growth temperature ranges, those of ordinary skill in this art will be able to replicate the disclosed process and the resulting structure without undue experimentation.

Figure 2:
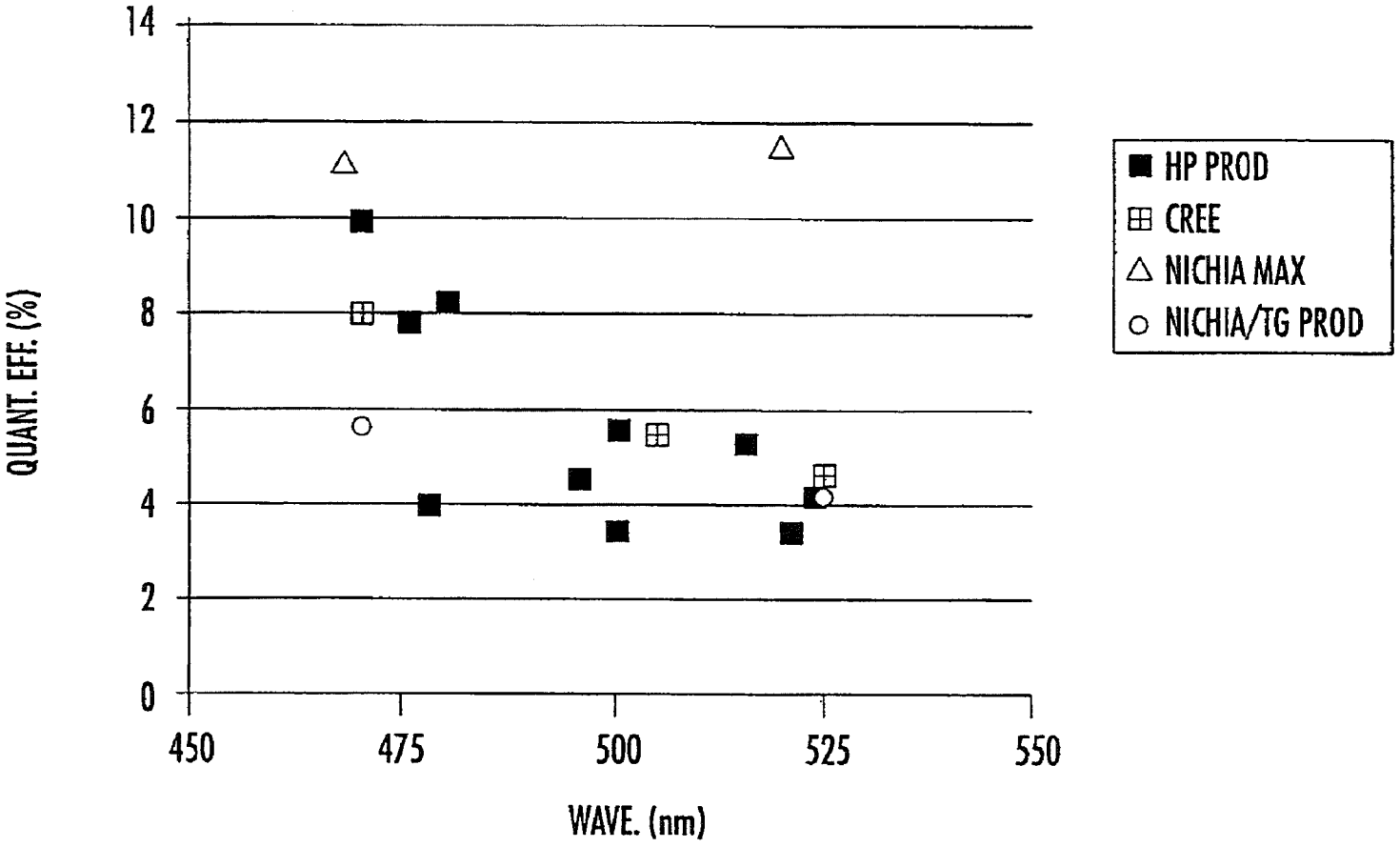
FIG. 2 is a comparative plot of the quantum efficiency of diodes according to the present invention and those of prior devices.

FIGS. 2 through 6 illustrate some of the demonstrated advantages of diodes designed and manufactured according to the present invention. FIG. 2 illustrates that the quantum efficiency of LEDs according to the present invention are at least as good as several others formed on sapphire substrates. Furthermore, the vertical device provides a much smaller chip than do equivalent sapphire based devices, while producing the same output. For example, sapphire based devices evaluated for comparative purposes herein (e.g. FIGS. 2, 3, and 4) are 14 mil×14 mil (196 $mil^2$) while those according to the present invention (and providing the same brightness) are 10 mil×10 mil (100 $mil^2$); i.e. only 57 percent as large.

Figure 3:
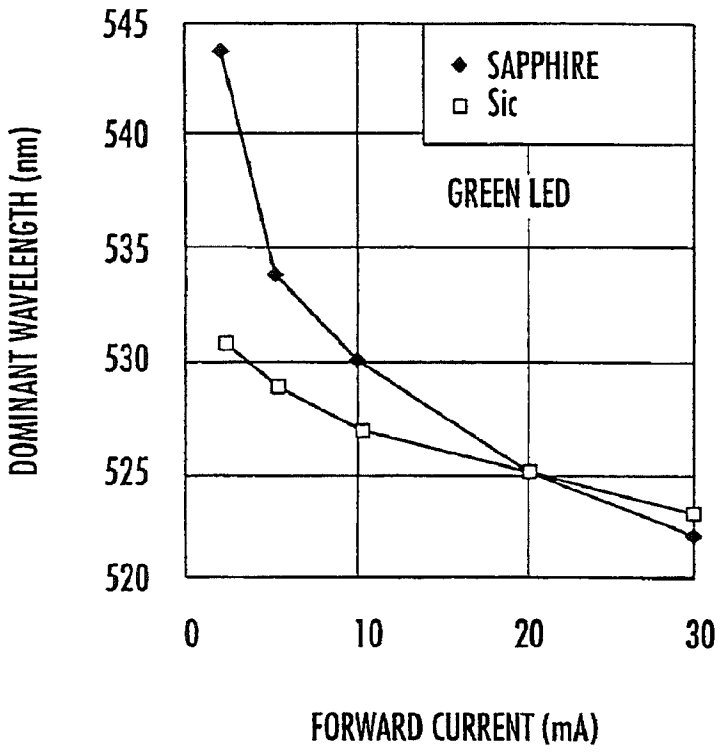
FIG. 3 is a plot of dominant wavelength versus forward current and comparing light emitting diodes of the present invention with those formed on sapphire substrates.

FIG. 3 illustrates that LEDs according to the present invention maintain a more consistent color over a range of forward currents than do devices formed on sapphire. As FIG. 3 shows, the sapphire-based LEDs tend to emit in or near the yellow portion of the spectrum at low forward current (e.g., 544 nm at 2 milliamps) while the LEDs according to the invention remain in the green region (531 nm at 2 mA).

Figure 4:
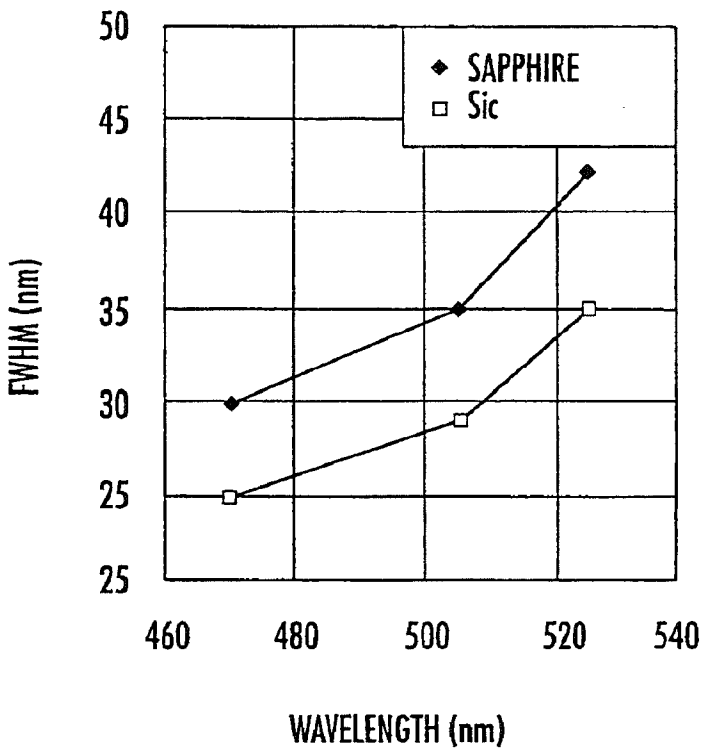
FIG. 4 is a plot of the full width at half maximum versus wavelength for diodes according to the present invention compared to those formed on sapphire.

FIG. 4 shows that SiC-based LEDs according to the present invention exhibit narrower emissions (purer colors) at desired wavelengths; i.e., at each measured wavelength, the full width at half maximum (FWHM) for the SiC-based LEDs is at least about 5 nm less than that of the sapphire-based diodes.

Figure 6:
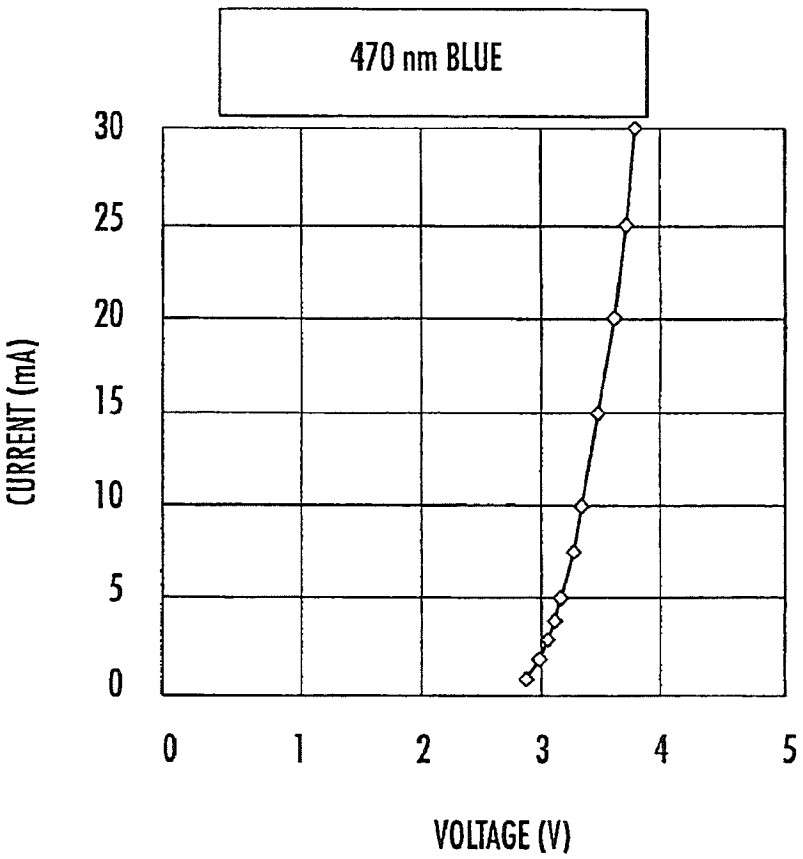
FIGS. 5 and 6 are plots of the current versus voltage characteristics of two diodes according to the present invention.
Figure 5:
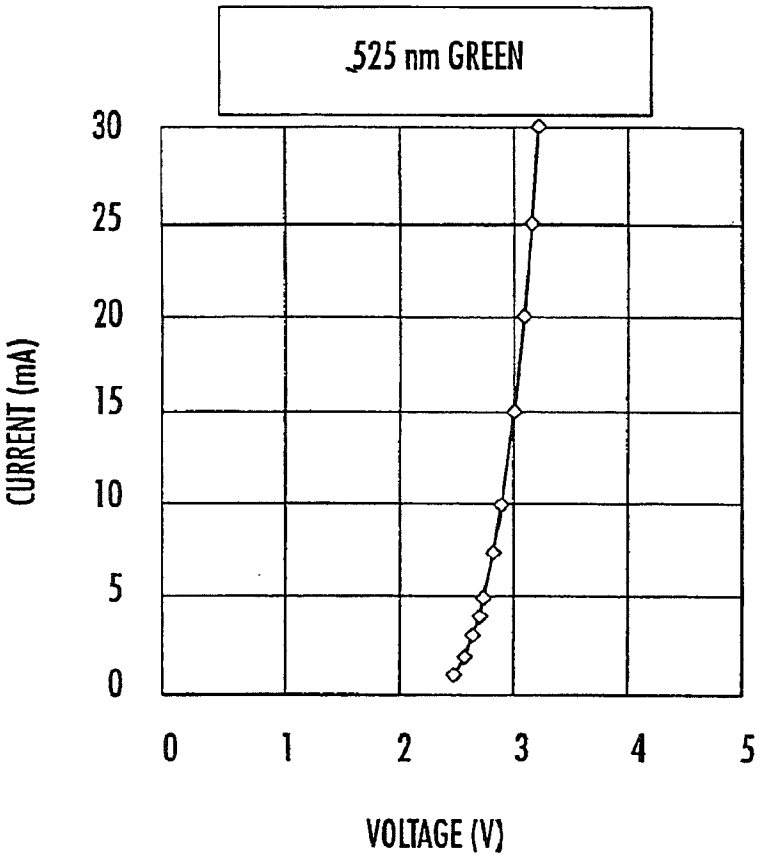

FIGS. 5 and 6 show that both green (525 nm) and blue (470 nm) LEDs according to the present invention provide excellent current characteristics under forward bias voltage.

In use, the diodes of the present invention can be used to provide both pixels and displays that incorporate red, green and blue LEDs.

In the drawings and specification, there have been disclosed typical embodiments of the invention, and, although specific terms have been employed, they have been used in a generic and descriptive sense only and not for purposes of limitation, the scope of the invention being set forth in the following claims.

That which is claimed is:

[1. A vertical geometry light emitting diode that is capable of emitting light in the electromagnetic spectrum, said light emitting diode comprising:

a conductive silicon carbide substrate;

an InGaN quantum well;

a conductive buffer layer between said substrate and said quantum well;

a respective undoped gallium nitride layer on each surface of said quantum well;

ohmic contacts in a vertical geometry orientation;

a doped layer of gallium nitride between said buffer and said undoped gallium nitride layer;

an undoped layer of aluminum gallium nitride on the surface of said undoped gallium nitride layer on said quantum well that is opposite from said substrate and buffer; and a doped layer of aluminum gallium nitride on said undoped aluminum gallium nitride layer.]

[2. A vertical geometry light emitting diode according to claim 1 and further comprising a doped gallium nitride layer on said doped aluminum gallium nitride layer.]

[3. A vertical geometry light emitting diode according to claim 2 wherein: said substrate, said buffer layer and said gallium nitride layer adjacent said buffer are all n-type; and said doped layer of aluminum gallium nitride and doped layer of gallium nitride thereon are p-type.]

[4. A vertical geometry light emitting diode according to claim 1 wherein said quantum well comprises a multiple quantum well.]

[5. A pixel that includes a light emitting diode according to claim 1.]

[6. A display that includes a plurality of pixels according to claim 5.]

*7. A light emitting diode comprising:*

*a p-type GaN layer;*

*a quantum well; and*

*an undoped GaN layer between the p-type GaN layer and the quantum well;*

*an undoped AlGaN layer on a surface of said undoped GaN layer between the undped GaN layer and the p-type GaN layer; and*

*a p-type AlGaN layer on said undoped AlGaN layer between said undoped AlGaN layer and said p-type GaN layer.*

*8. A light emitting diode according to claim 7, wherein the undoped GaN layer is directly on the quantum well and the undoped AlGaN layer.*

*9. A light emitting diode according to claim 7, wherein the undoped AlGaN layer has a thickness of about 30 Angstroms to about 50 Angstroms.*

*10. A light emitting diode according to claim 7, wherein the undoped GaN layer has a thickness of about 20 Angstroms to about 30 Angstroms.*

*11. A light emitting diode according to claim 7, further comprising a second undoped GaN layer, wherein the quantum well is between the second undoped GaN layer and the undoped GaN layer.*

*12. A vertical geometry light emitting diode according to claim 7, wherein said quantum well comprises a multiple quantum well.*

*13. A vertical geometry light emitting diode according to claim 7, wherein said quantum well comprises a single quantum well.*

*14. A pixel that includes a light emitting diode according to claim 7.*

*15. A display that includes a plurality of pixels according to claim 14.*

*16. A light emitting diode comprising:*

*an n-type GaN layer;*

*a p-type GaN layer on the n-type GaN layer;*

*a quantum well between the p-type GaN layer and the n-type GaN layer;*

*a first undoped GaN layer directly on the quantum well between the p-type GaN layer and the quantum well;*

*an undoped AlGaN layer directly on the first undoped GaN layer wherein the first undoped GaN layer is between the undoped AlGaN layer and the quantum well; and*

*a p-type AlGaN layer on the undoped AlGaN layer between the undoped AlGaN layer and the p-type GaN layer.*

*17. A light emitting diode according to claim 16, further comprising a second undoped GaN layer between the quantum well and the n-type GaN layer.*

*18. A light emitting diode according to claim 16, wherein the first undoped GaN layer has a thickness of about 20 Angstroms to about 30 Angstroms.*

*19. A light emitting diode according to claim 16, wherein the undoped AlGaN layer has a thickness of about 30 Angstroms to about 50 Angstroms.*

*20. A light emitting diode according to claim 16, wherein said quantum well comprises a multiple quantum well.*

*21. A light emitting diode according to claim 16, wherein said quantum well comprises a single quantum well.*

*22. A pixel that includes a light emitting diode according to claim 16.*

*23. A display that includes a plurality of pixels according to claim 22.*

* * * * *